(12) United States Patent
Caradonna et al.

(10) Patent No.: US 6,722,215 B2
(45) Date of Patent: Apr. 20, 2004

(54) MANIPULATOR APPARATUS WITH LOW-COST COMPLIANCE

(76) Inventors: Michael Caradonna, 1701 Austin Ave., Los Altos, CA (US) 94024; Sarosh Patel, 525 Iverness Way, Sunnyvale, CA (US) 94087

( * ) Notice: Subject to any disclaimer, the term of this patent is extended or adjusted under 35 U.S.C. 154(b) by 0 days.

(21) Appl. No.: 10/176,261

(22) Filed: Jun. 18, 2002

(65) Prior Publication Data

US 2003/0230155 A1 Dec. 18, 2003

(51) Int. Cl.[7] .............................................. G01D 21/00
(52) U.S. Cl. ....................................................... 73/866.5
(58) Field of Search ............................. 73/866.5, 865.8; 267/113, 116, 117, 118, 119, 121, 122; 324/754, 758, 761, 765

(56) References Cited

U.S. PATENT DOCUMENTS

| | | | |
|---|---|---|---|
| 3,117,752 A | * | 1/1964 | Gillmore |
| 3,154,273 A | * | 10/1964 | Paulsen ................ 267/140.11 |
| 3,348,796 A | * | 10/1967 | Baratoff et al. ............. 248/565 |
| 3,667,707 A | * | 6/1972 | Mui ........................... 248/550 |
| 4,846,458 A | | 7/1989 | Potts |
| 4,884,027 A | * | 11/1989 | Holderfield et al. ........ 324/765 |
| 4,893,074 A | * | 1/1990 | Holt et al. .................. 324/758 |
| 5,312,313 A | | 5/1994 | Holmes et al. |
| 5,499,959 A | | 3/1996 | Holmes et al. |
| 5,931,048 A | | 8/1999 | Slocum et al. |
| 5,949,002 A | | 9/1999 | Alden |

* cited by examiner

Primary Examiner—Robert R. Raevis
(74) Attorney, Agent, or Firm—Teradyne Legal Dept.

(57) ABSTRACT

A compliance assembly is disclosed for use in a semiconductor tester testhead stand. The compliance assembly includes an airspring having compliance along a plurality of axes and a containment vessel adapted for receiving the airspring. The containment vessel includes walls that, when the airspring is loaded, control the compliance along the plurality of axes.

8 Claims, 6 Drawing Sheets

MANIPULATOR APPARATUS WITH LOW-COST COMPLIANCE

FIELD OF THE INVENTION

The invention relates generally to automatic test equipment, and more particularly to a reduced-cost manipulator apparatus employed for use with automatic test equipment.

BACKGROUND OF THE INVENTION

Automatic test equipment provides semiconductor device manufacturers the ability to test each and every device fabricated. By testing each device, the manufacturer can sort devices having like speeds, and/or separate failed devices from passing devices. In this manner, the manufacturer is able to confidently put fully functioning devices into the marketplace.

Automatic test equipment, often referred to as a tester, typically employs a mainframe or computer workstation and a testhead. The testhead houses sophisticated electronics and includes interface circuitry for coupling the electronics close to the devices-under-test (DUTs). This is done in order to minimize propagation delays on the test signals transmitted between the testhead and the DUTs. The DUTs are typically positioned on a prober (if at the wafer level) or handler (if at the packaged-device level).

Due to the size and weight of a conventional testhead, coupling the tester electronics to the DUTs involves carefully docking the testhead to the handler or prober (hereafter generically referred to as a handling device). The device employed to carry and position the testhead for docking is a manipulator. FIG. 1 illustrates a conventional manipulator 10 adapted for carrying and positioning a testhead 12.

Further referring to FIG. 1, the conventional manipulator includes a base 14 and a cradle 15 for engaging and carrying the testhead 12. A positioning mechanism 16 provides the ability to displace the two-thousand pound testhead along a plurality of compliance axes with manual control. Conventionally, one example of the mechanism includes high-precision linear bearings 18 that cooperate with telescopically sliding members to provide compliance needed to carefully position the testhead. Generally, compliance refers to the force applied by the manipulator to offset the force of gravity acting on the testhead. Once leveraged out, the compliance allows the testhead to be moved around in any direction. The mechanism is actuated by a pneumatic or hydraulic piston 20. Alignment pins (not shown), help to guide the testhead onto the handling apparatus.

While this example of a conventional manipulator works well for its intended applications, the mechanical construction for establishing compliance employs parts and assemblies built to a high degree of precision with very tight tolerances. This translates into a high cost of fabrication.

What is needed and currently unavailable is a manipulator solution that provides multiple axes of compliance with low-cost components. The low-cost manipulator of the present invention satisfies this need.

SUMMARY OF THE INVENTION

The manipulator of the present invention employs low-cost components to effect reliable and accurate multi-axial compliance without sacrificing performance. This correspondingly reduces test costs for semiconductor device manufacturers.

To realize the foregoing advantages, the invention in one form comprises a compliance assembly for use in a semiconductor tester testhead stand. The compliance assembly includes an airspring having compliance along a plurality of axes and a containment vessel adapted for receiving the airspring. The containment vessel includes walls that, when the airspring is loaded, control the compliance along the plurality of axes.

In another form, the invention comprises a testhead stand for compliantly docking a semiconductor tester testhead to a handling apparatus. The testhead stand includes a base having oppositely disposed side members and a pair of spaced-apart extension members. The extension members are disposed on the side members and project upwardly therefrom. A pair of compliance assemblies disposed on the pair of extension members are adapted to receive the testhead. Each compliance assembly includes an airspring having compliance along a plurality of axes and a containment vessel. The containment vessel is adapted for receiving the airspring and has walls that, when the airspring is loaded, control the compliance along the plurality of axes.

In a further form, the invention comprises a linkage-based manipulator for automatic test equipment. The linkage-based manipulator includes a base and a cradle having a testhead end adapted for coupling to a testhead. The manipulator further includes a linkage means for vertically displacing the cradle between a lower position and an upper position while maintaining the cradle parallel to the base and while avoiding any horizontal displacement. A load element pivotally mounted at one end to the base and at the other end to the linkage means provides a force to the linkage means opposite the force of gravity acting on the testhead.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The manipulator of the present invention provides a low-cost way to position semiconductor tester testheads without sacrificing the necesssary compliance to carefully dock to a handling apparatus. This is done by employing a low-cost airspring-based compliance assembly in the manipulator rather than expensive high-tolerance linear bearings and the like.

Figure 1:
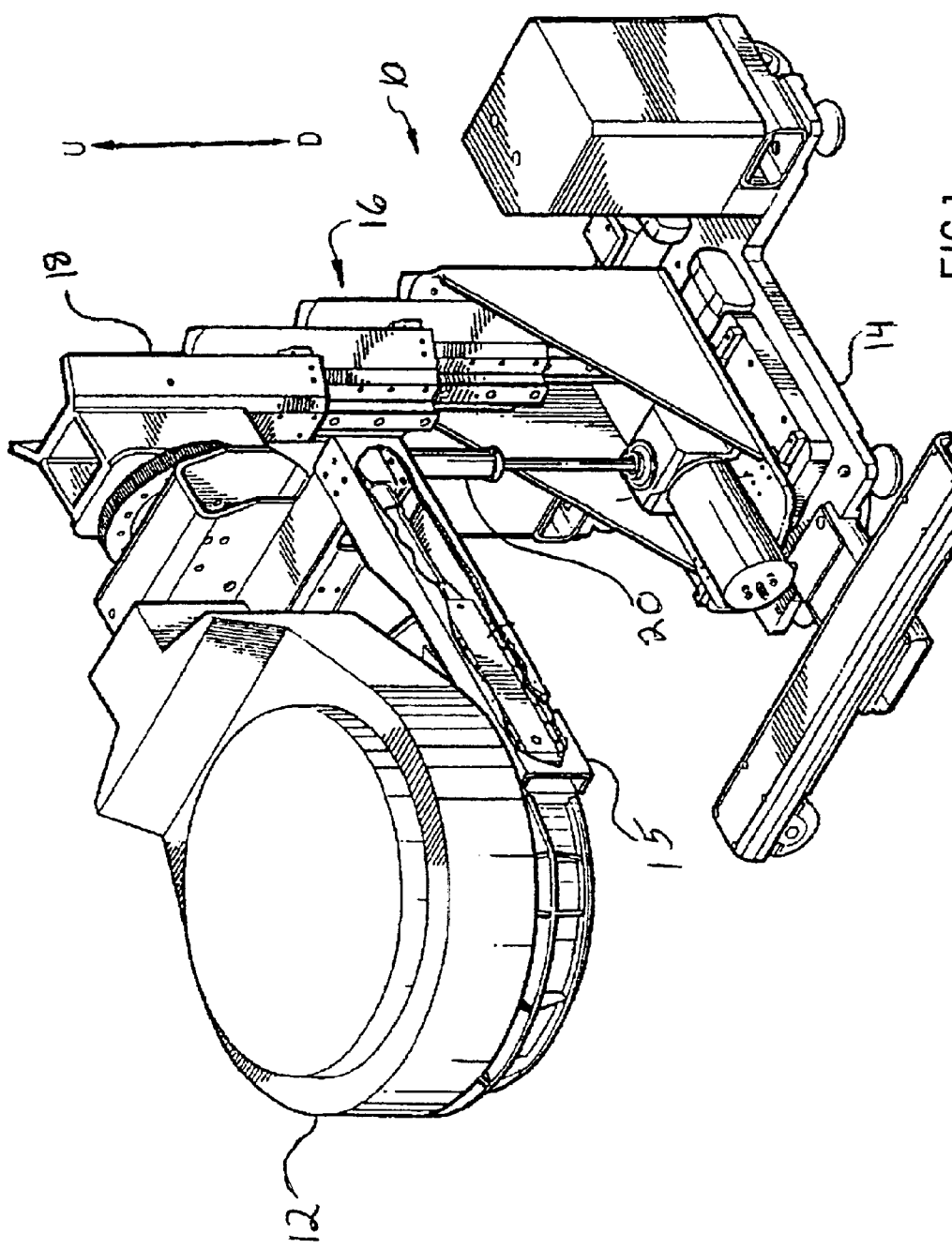
FIG. 1 is a high-level block diagram of a conventional manipulator.
Figure 2:
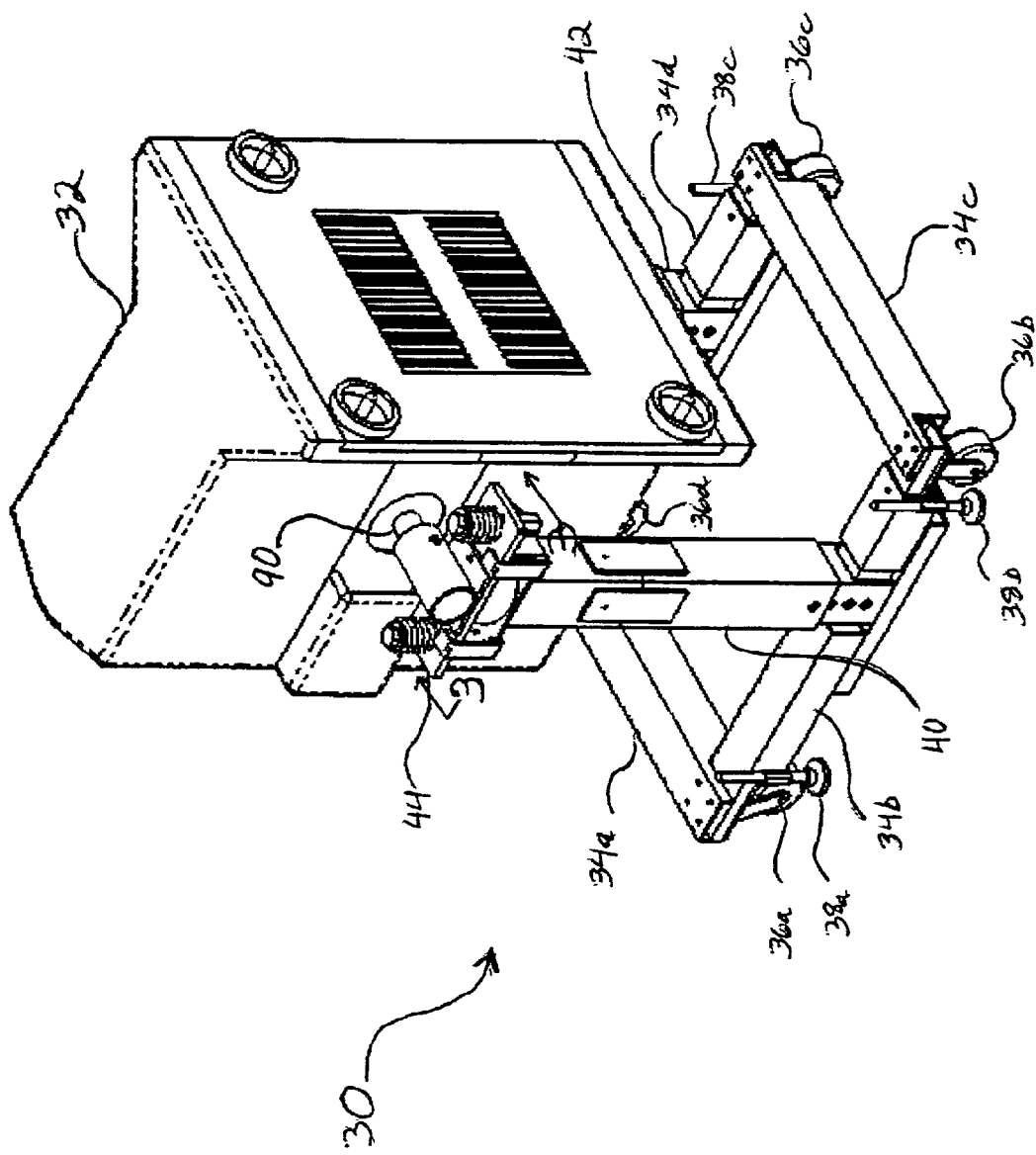
FIG. 2 is a perspective view of a testhead stand according to one form of the present invention.

FIG. 2 illustrates a low-cost manipulator, or testhead stand, generally designated 30, for holding a semiconductor tester testhead 32 in a given orientation, while providing multiple compliant degrees-of-freedom. This compliance is often necessary to dock the testhead to a handler (for packaged devices, not shown) or a prober (for wafer-level devices, not shown). Bulk motion is often provided by a dedicated service manipulator, such as the conventional manipulator 10 described previously and shown in FIG. 1.

Further referring to FIG. 2, the testhead stand 30 includes a rectangular base formed with a plurality of slidable tubular elements 34a–34d. The base is carried by a plurality of corner-disposed casters 36a–36d to provide mobility for the stand. Leveling feet 38a–38c (fourth caster not shown) are provided to establish a level platform once the stand is situated in a static position.

Mounted on opposite sides of the base are upwardly projecting extendable support beams 40 and 42. The support beams form a pair of support structures suitable for mounting respective compliant assemblies 44 (only one assembly shown in FIG. 2).

Figure 3:
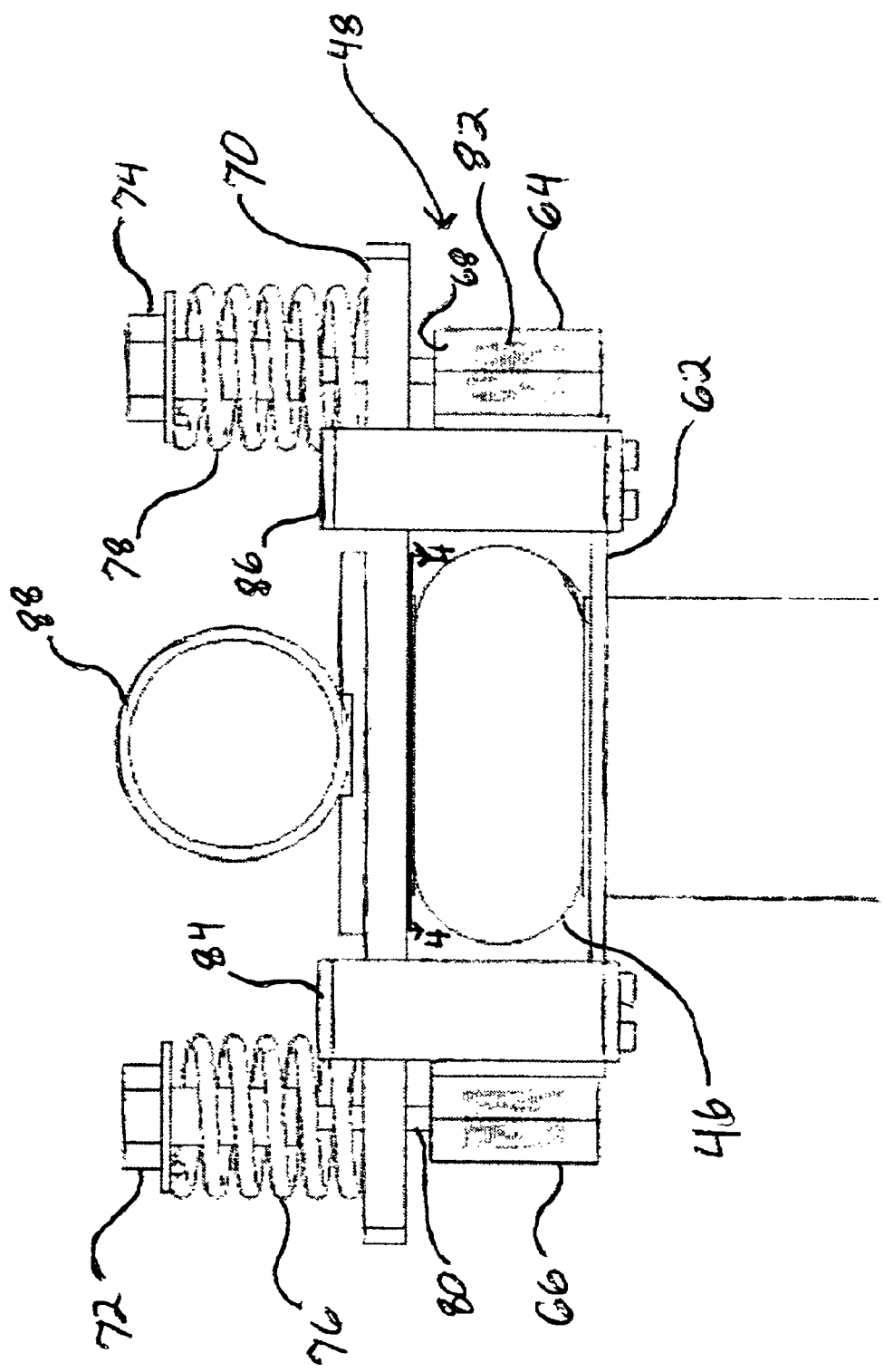
FIG. 3 is a partial lateral view of the compliance assembly along line 3—3 of FIG. 2.
Figure 4:
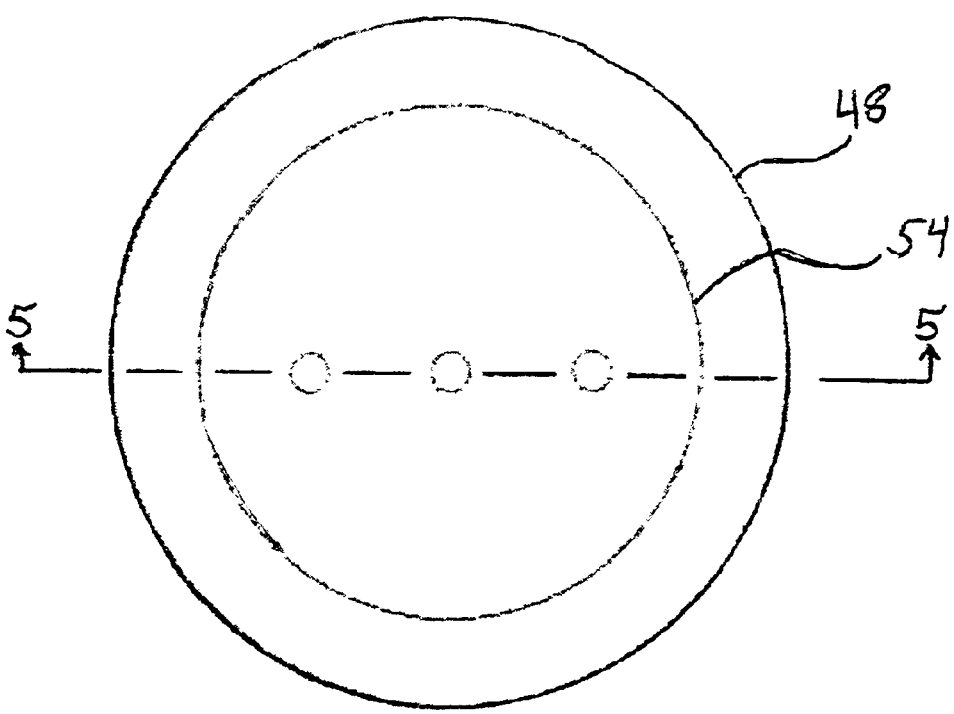
FIG. 4 is a plan view of the airspring along line 4—4 of FIG. 3.
Figure 5:
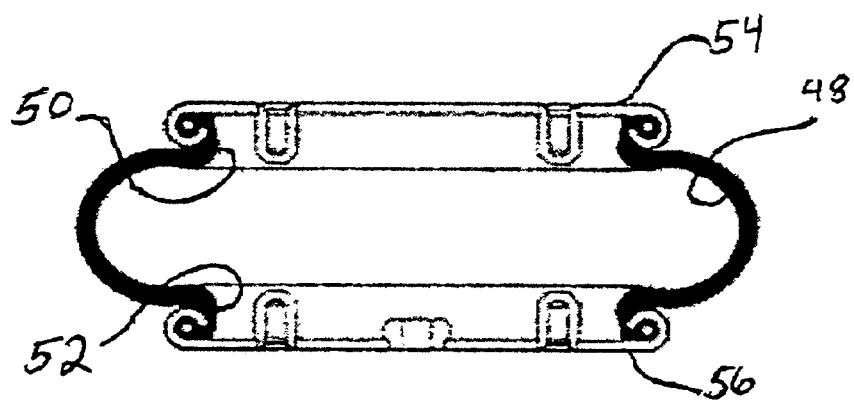
FIG. 5 is a cross-sectional view of the airspring along line 5—5 of FIG. 3.

With particular reference to FIGS. 3, 4 and 5, each compliance assembly 44 includes an airspring 46 constrained within a containment vessel 60. The airspring comprises a resilient hollow body 48 (FIG. 5) having respective spaced-apart axial sides 50 and 52. A pair of circular metallic disks 54 and 56 are mounted to the axial sides to seal the inside of the hollow body. A valve (not shown) provides for pressurization of the airspring to a suitable compliant level. Preferred airsprings are available as model #s W01-358-7731, 7751, AND 7451, available from Firestone Corporation.

Further referring to FIG. 3, the containment vessel 60 includes a base plate 62 formed with upwardly projecting side walls 64 and 66. The side walls are formed respectively with upwardly opening threaded bores 68. With the airspring 46 situated on the base plate 62, a floating load plate 70 is disposed on the airspring. In this manner, the airspring is effectively sandwiched between the base plate and the load plate. A pair of stabilizer assemblies are positioned on each end of the load plate and include respective threaded bolts 72 and 74 biased by stabilizer springs 76 and 78. The bolts include threaded shanks 80 and 82 that mate to the base plate threaded bores, and place the springs in compression to minimize lateral load imbalances on the airspring. C-shaped overtravel stops 84 and 86 are also mounted to the base plate 62 and extend over and above the load plate 70 a predetermined height to prevent the plates from vertically separating beyond the stop height.

In a preferred embodiment, a pair of horizontally and oppositely disposed open-ended bolt tubes 88 (second tube not shown) are secured to the load plate 70 and are adapted to receive correspondingly formed cylindrical bolts (often referred to as "Frankenstein" bolts) 90 (FIG. 2) that carry the testhead 32.

Prior to operation, the testhead 32 is first installed onto the stand 30 through use of a service manipulator, as alluded to previously. Once installed in the stand, the testhead may be moved to the docking interface of a handler or prober (not shown). The service manipulator is then free to install another testhead on another stand. Once positioned near the docking interface, the testhead may be finely manipulated, as required, to effect a final docking. The multiple compliant degrees of freedom provided by the compliance assemblies allow for the fine positioning.

One of the key cost advantages realized through the use of low-cost manipulator stands lies in the ability to leverage the cost of a single expensive service manipulator across several test systems while providing the individual inexpensive stands to each test system for support and final compliant positioning of the testhead.

Figure 6:
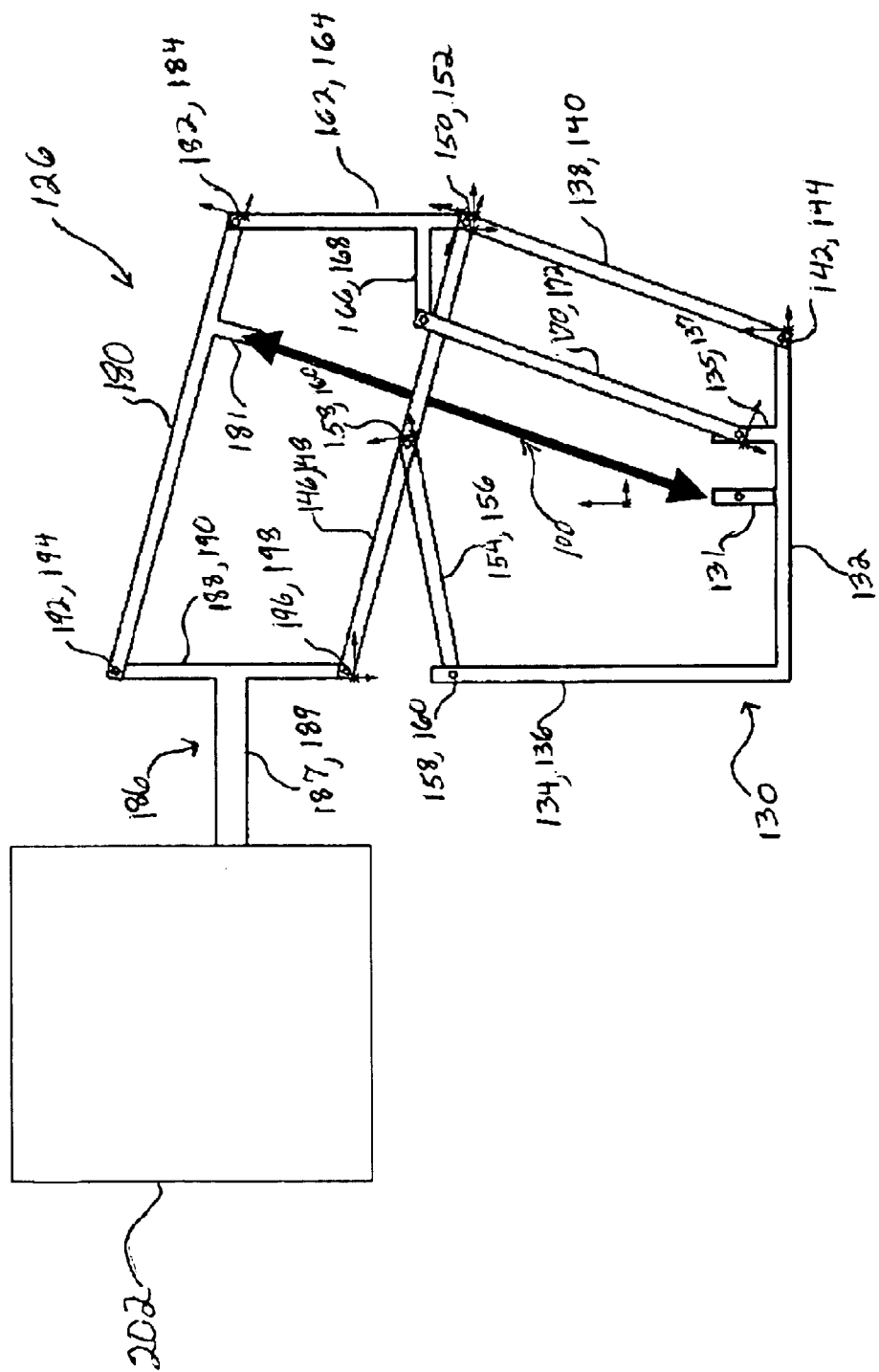
FIG. 6 is a side view block diagram of an alternative manipulator according to the present invention.
Figure 7:
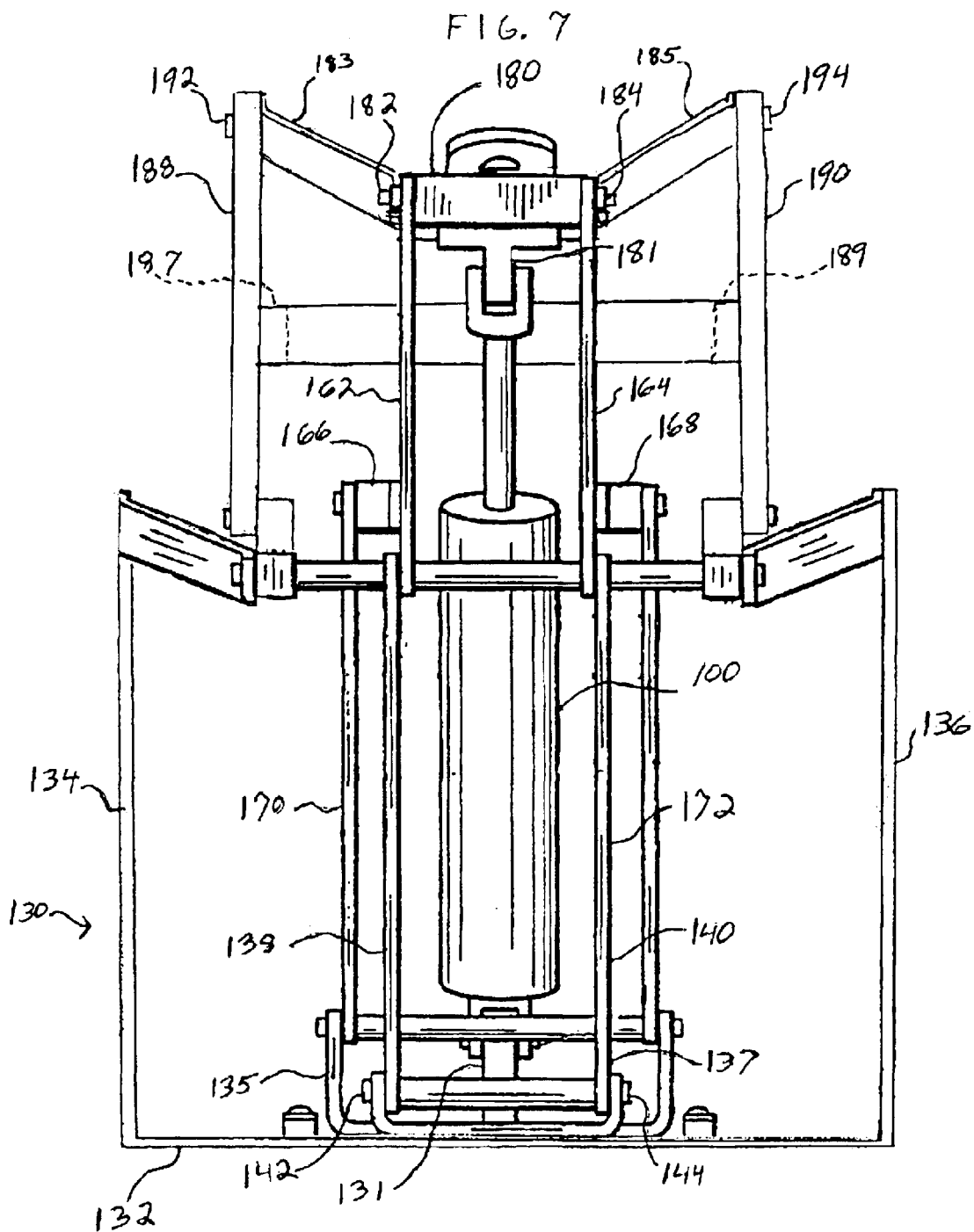
FIG. 7 is a rear perspective view of the manipulator of FIG. 6.

Referring now to FIGS. 6 and 7, a manipulator according to a second embodiment of the present invention, generally designated 126, includes a support frame 130 having a base 132 with respective vertically upstanding struts 131, 133 and 135, 137. A pair of upstanding bars project vertically from the front end of the base. As can be seen more clearly from FIG. 7, much of the linkage construction comprises two parallel structures disposed on each side of the base. Consequently, because FIG. 6 illustrates a side view, only one of the structures is clearly visible.

Further referring to FIGS. 6 and 7, a pair of rear-disposed lower support members 138, 140 are pivotally coupled to the base at respective joints 142, 144. The opposite ends of the support members terminate at the respective rear ends of a pair of lower arms 146, 148 at pivots 150, 152. A pair of stabilizer arms 154, 156 are pivotally disposed between the vertically upstanding bars 134, 136 at pivots 158, 160 and the lower arms 146, 148 at joints 158, 160. The resulting construction defines a pair of side-by-side lower parallelograms.

Cooperating with the lower parallelograms are a pair of upper side-by-side parallelogram links as more fully described below. Coupled to the pair of lower support members 138, 140 at joints 150, 152 are a pair of upper support members 162, 164. The upper support members each include respective horizontally projecting struts 166, 168. Pivotally disposed between the horizontal struts and the base vertical struts 135, 137 are a pair of parallel front upright support members 170, 172.

With continuing reference to FIGS. 6 and 7, disposed in parallel relationship to the lower arms 146, 148 is a moment arm beam 180. The moment arm beam comprises an elongated bar and a pair of forks 183, 185 mounted at the testhead end. The beam couples to the upper support members 162, 164 at pivots 182, 184. A cantilevered support 186 is pivotally disposed between the ends of the moment arm beam forks 183, 185 and the lower arms 146, 148 at joints 192, 194, and 196, 198. The support includes a pair of cantilevered arms 187, 189 and a pair of vertical beams 188, 190. The beams are of a length matching the length of the upper support members 162, 164. This ensures that the moment arm beam 180 and the lower arms maintain a parallel relationship. The cantilever arms define a cradle for carrying a semiconductor tester testhead 202.

To effect vertical displacement of the cantilevered support without any horizontal displacement, a load element is pivotally coupled between the moment arm beam strut 181 and a base strut 131a. The load element preferably comprises the airspring-based construction previously described with respect to the first embodiment of the present invention, and illustrated in FIGS. 1 through 5. Control over the load element operation is provided through a control system (not shown) that monitors the load acting on the load element, and generates enough counter-load to effect compliance over the testhead. The construction additionally employs a braking system (not shown) to lock the linkages into a predetermined position once docking has occurred.

Optionally, to effect additional rotational bulk motion, or twist, with the cradle, a twist bearing (not shown) may be employed proximate the cradle. Similarly, a twist bearing (not shown) may also be implemented on the base to provide rotational bulk motion along a base rotational axis.

Operation of the linkage-based manipulator is different to that of the stand manipulator in that the linkages provide bulk compliance for the testhead in addition to fine compliance that the stand offers. Specifically, the load element is pressurized to effect actuation of the linkages as desired by the user. Positive pressurization will force the structure to raise the platform, albeit in a vertical plane, while depressurizing the load element causes a lowering of the platform. Once a coarse position is set, the operator may manually place the testhead into its final docking position with the handler/prober.

Those skilled in the art will appreciate the many benefits and advantages afforded by the present invention. Of significant importance is the implementation of a low-cost airspring to achieve compliance in a testhead manipulator without sacrificing manipulator performance.

While the invention has been particularly shown and described with reference to the preferred embodiments thereof, it will be understood by those skilled in the art that various changes in form and detail may be made therein without departing from the spirit and scope of the invention.

What is claimed is:

1. A compliance assembly for use in a semiconductor tester testhead stand, the testhead stand having a pair of extension members, the compliance assembly including:

an airspring having compliance along a plurality of axes; and a containment vessel adapted for receiving the airspring and adapted for positioning on one of the pair of extension members the containment vessel having walls that, when the airspring is loaded, control the compliance along the plurality of axes.

2. A compliance assembly according to claim 1 wherein the airspring comprises:

a resilient hollow body having respective axial sides, and a pair of oppositely disposed disks mounted to the axial sides and cooperating with the body to form an airtight structure.

3. A compliance assembly according to claim 1 wherein the containment vessel includes:

a base plate, and a floating load plate, the airspring sandwiched between the base plate and the load plate.

4. A compliance assembly according to claim 3 wherein the containment vessel further includes:

a stabilizer assembly coupled to the base plate and the floating load plate to offset imbalanced loading on the load plate.

5. A compliance assembly for use in a semiconductor tester testhead stand, the testhead stand having a pair of extension members, the compliance assembly including:

means for complying along a plurality of axes; and means for receiving the means for complying, the means for receiving adapted for positioning on one of the pair of extension members, the means for receiving comprising means for controlling the complying along the plurality of axes.

6. A compliance assembly according to claim 5 wherein the means for complying comprises an airspring.

7. A compliance assembly according to claim 5 wherein the means for receiving comprises a containment vessel.

8. A method of providing compliance in a semiconductor tester testhead stand, the testhead stand having a pair of extension members, the method comprising the steps:

selecting an airspring having compliance along a plurality of axes; and controlling the compliance from the airspring with a containment vessel adapted for positioning on one of the pair of extension members.

* * * * *